(12) United States Patent
Dror et al.

(10) Patent No.: US 9,620,663 B2
(45) Date of Patent: Apr. 11, 2017

(54) DETERMINING TIMING FOR CLEANING ELECTRICITY GENERATING SOLAR PANELS

(71) Applicant: DERECH HAGAV LTD., Hibat Zion (IL)

(72) Inventors: Jack Dror, Atlit (IL); Avraham Shay Balouka, Gan Yoshiya (IL)

(73) Assignee: Avraham Shay Balouka, Gan Yoshiya (IL)

( * ) Notice: Subject to any disclaimer, the term of this patent is extended or adjusted under 35 U.S.C. 154(b) by 160 days.

(21) Appl. No.: 14/355,591

(22) PCT Filed: Nov. 4, 2012

(86) PCT No.: PCT/IL2012/050439
§ 371 (c)(1),
(2) Date: May 1, 2014

(87) PCT Pub. No.: WO2013/065053
PCT Pub. Date: May 10, 2013

(65) Prior Publication Data
US 2014/0251034 A1   Sep. 11, 2014

(30) Foreign Application Priority Data
Nov. 3, 2011 (GB) .................................. 1118984.2

(51) Int. Cl.
*H01L 31/18* (2006.01)
*F24J 2/40* (2006.01)
(Continued)

(52) U.S. Cl.
CPC .............. *H01L 31/18* (2013.01); *F24J 2/407* (2013.01); *F24J 2/461* (2013.01); *H02S 40/10* (2014.12); *Y02E 10/40* (2013.01)

(58) Field of Classification Search
CPC ..... F24J 2/407; F24J 2/461; F24J 2/40; H01L 31/18; H02S 40/10; Y02E 10/40
See application file for complete search history.

(56) References Cited

U.S. PATENT DOCUMENTS

| 9,126,341 B1* | 9/2015 | Meller ........................ F24J 2/40 |
| 2010/0212093 A1* | 8/2010 | Pak ............................ F24J 2/40 15/97.1 |

(Continued)

FOREIGN PATENT DOCUMENTS

| CN | 101378236 | 3/2009 |
| CN | 202275150 | 6/2012 |

(Continued)

OTHER PUBLICATIONS

Definition of "identical" downloaded from Merriam-Webster Jul. 29, 2016.*

(Continued)

*Primary Examiner* — Natalie Huls
(74) *Attorney, Agent, or Firm* — The Law Office of Joseph L. Felber

(57) ABSTRACT

A system for detecting an optimal timing for cleaning duty solar panels is provided herein. The system includes: a simulation sensor and a reference sensor which include photovoltaic cells identical to the photovoltaic cells of the duty solar panels, wherein the simulation sensor is configured to generate a simulation electrical signal which simulates electricity signal generated by the duty solar panels; and wherein the reference sensor is configured to generate a reference electrical signal which simulates electricity signal generated by the duty solar panels in a clean condition; and protection means configured to selectively expose the reference sensor for a specified period of time, wherein the system is configured to compare the simulation signal and the reference signal when the reference sensor is uncovered (Continued)

and provide an indication that the duty solar panels should be cleaned if a difference between the simulation and the reference signals exceeds a predefined level.

5 Claims, 3 Drawing Sheets

(51) Int. Cl.
*F24J 2/46* (2006.01)
*H02S 40/10* (2014.01)

(56) References Cited

U.S. PATENT DOCUMENTS

| | | | | |
|---|---|---|---|---|
| 2011/0073104 | A1* | 3/2011 | Dopp | F24J 2/055 126/651 |
| 2011/0146660 | A1* | 6/2011 | Cho | B08B 1/02 126/569 |
| 2011/0308318 | A1 | 12/2011 | Magnussen | |
| 2012/0138123 | A1* | 6/2012 | Newdoll | F24J 2/461 136/246 |
| 2013/0240005 | A1* | 9/2013 | Ho | H01L 31/02021 134/56 R |
| 2014/0100698 | A1* | 4/2014 | Suresh | H02S 40/10 700/275 |
| 2014/0375343 | A1* | 12/2014 | Chen | G01K 13/00 324/750.02 |
| 2015/0280644 | A1* | 10/2015 | Gostein | H02S 50/00 356/72 |
| 2016/0104084 | A1* | 4/2016 | Philip | H02S 50/00 705/7.13 |
| 2016/0359453 | A1* | 12/2016 | Jones | H02S 50/00 |

FOREIGN PATENT DOCUMENTS

| | | |
|---|---|---|
| EP | 2400559 | 12/2011 |
| KR | 20060066475 | 6/2006 |
| KR | 101032489 | 4/2011 |

OTHER PUBLICATIONS

Definition of "simulate" downloaded from Merriam-Webster Jul. 29, 2016.*
International Search Report of PCT Application No. PCT/IL2012/050439 mailed on Jan. 30, 2013.
European Search Report of European Application No. EP 12,84,5916 mailed May 18, 2015.

* cited by examiner

DETERMINING TIMING FOR CLEANING ELECTRICITY GENERATING SOLAR PANELS

CROSS-REFERENCE TO RELATED APPLICATIONS

This application is a National Phase Application of PCT International Application No. PCT/IL2012/050439, International Filing Date Nov. 4, 2012, entitled "DETERMINING TIMING FOR CLEANING ELECTRICITY GENERATING SOLAR PANELS", published on May 10, 2013 as International Publication Number WO 2013/065053, claiming priority of GB Patent Application No. GB 1118984.2, filed Nov. 3, 2011, both of which are incorporated herein by reference in their entirety.

TECHNICAL FIELD OF THE INVENTION

The present invention relates to a system and a method of detecting the timing for cleaning solar panels.

BACKGROUND OF THE INVENTION

Over the last few decades, with the resources on the earth being depleted daily, investment in exploring alternative energy sources has increased significantly. One of these alternative energy sources is solar energy which has drawn much attention from the energy industry. Photovoltaic cells (PV), which convert sunlight directly into electricity, were first exclusively used in space, as far back as the late 1950's, to power satellites' electrical systems. Since then, these PV cells have been used in a wide variety of fields, from calculators to emergency road signs, call boxes and even buoys. The technology continues to be used in new devices all the time, from sunglasses to electrical vehicle charging stations. These devices never need batteries and as long as there is enough light, they seem to work forever.

PV cells are made of semiconductors such as silicon, which is currently used most commonly. Basically, when sunlight strikes the cell, a certain portion of it is absorbed within the semiconductor material. This means that the energy of the absorbed light is transferred to the semiconductor. The energy knocks electrons loose, allowing them to flow freely.

PV cells also all have one or more electric field that acts to force electrons freed by light absorption to flow in a certain direction. This flow of electrons is a current, and by placing metal contacts on the top and bottom of the PV cell, it is possible to draw that current off for external use, for example, to power a calculator. This current, together with the cell's voltage (which is a result of its built-in electric field or fields), defines the power (or wattage) that the solar cell can produce.

The field forms when the N-type and P-type silicon come into contact. Suddenly, the free electrons on the N side start to fill the openings on the P side. Eventually, equilibrium is reached, and there is an electric field separating the two sides.

When light, in the form of photons hits the solar cell, its energy breaks apart electron-hole pairs. Each photon with enough energy will normally free exactly one electron, resulting in a free hole as well. If this happens close enough to the electric field, the field will send the electron to the N side and the hole to the P side. This causes further disruption of electrical neutrality, and if an external current path is provided, electrons will flow through the path to the P side to unite with holes that the electric field sent there. The electron flow provides the current, and the cell's electric field causes a voltage. With both current and voltage, there is power, which is the product of the two.

Since silicon is a very shiny material, which can reflect photons rather than absorbing them, an antireflective coating is applied to reduce those losses. The final step is to install something that will protect the cell from the environment—often a glass cover plate. Solar panels are generally made by connecting several individual cells together to achieve useful levels of voltage and current, and putting them in a sturdy frame complete with positive and negative terminals.

To maximize reception of solar energy, the solar panel is normally in an elevated position and angled. This, combined with exposure to the elements, creates a need for frequent cleaning, especially since the efficiency of electricity generation is reduced due to the amount of dust and dirt accumulated on the transparent covers of solar panels. Another problem that is encountered is that, if the day is cloudy and sunlight does not hit the solar panel, then the efficiency of the electricity generation is also reduced. Or alternatively it may be a combination of the two factors. Thus, it is difficult to determine which of the factors is responsible for the reduced efficiency in the electricity generation.

In order to solve the first problem (of determining if the solar panel requires cleaning) the idea of comparing two sensors in order to compare a duty measurement to a reference measurement is well known in the art, for example, in US2009266353. This document discloses a method for automatically cleaning a solar panel utilizing an automatic cleaning system. An environmental intensity of sunlight in the outside environment is obtained with an environmental light sensor, and a transmitted intensity of incident sunlight throughout the protection panel is obtained using a transmission light sensor. The difference value between the environmental intensity and the transmitted intensity is then detected and by comparing the detection difference value with a predetermined value, it can be determined if the solar panel requires cleaning or not. If cleaning is required, various methods can be employed, including manual cleaning or by the use of an automatic cleaning device.

The usual problem in the prior art is that ambient sensors are prone to dust accumulation by themselves and so the indication of dirt on the solar panels is no longer reliable.

SUMMARY

Hereinafter, is provided an overview of the subject matter disclosed below. It should not be construed, however, as limiting the invention to any features described herein.

The present invention seeks to alleviate to some extent the problems indicated above.

The present invention provides a system for detecting an optimal timing for cleaning solar panels; said solar panels comprising photovoltaic cells; said system comprising two sensors; said one sensor acting as a simulation sensor which simulates a photovoltaic cell of the solar panel; the other sensor acting as a reference sensor; wherein said simulation sensor is provided with a cover similar to the cover of the duty solar panels; said reference sensor being provided with a protection means; wherein said protection means are arranged to expose the reference sensor periodically for a very short time.

In one embodiment of the invention, the reference and simulation sensors are implemented as photovoltaic cells.

Each one of the sensors may generate electricity. The comparison between the two measurements may be analyzed in view of a predefined threshold. In case the difference between the measurements of the electricity generated is beyond the threshold, a cleaning alert is issued. On the other hand, as the reference sensor is always clean, it should always produce an electrical signal. Only in the case that there is no sunlight, will the reference sensor not produce an electrical signal. This is then an indication that it is not dirt or debris on the solar panels which is causing failure, but a lack of sunlight.

BRIEF DESCRIPTION FOR THE DRAWINGS

Examples illustrative of embodiments of the invention are described below with reference to the figures attached hereto. In the figures, identical structures, elements or parts that appear in more than one figure are generally labeled with the same number in all the figures in which they appear. Dimensions of components and features shown in the figures are generally chosen for convenience and clarity of presentation and are not necessarily shown to scale.

DETAILED DESCRIPTION OF THE DRAWINGS

Figure 1:
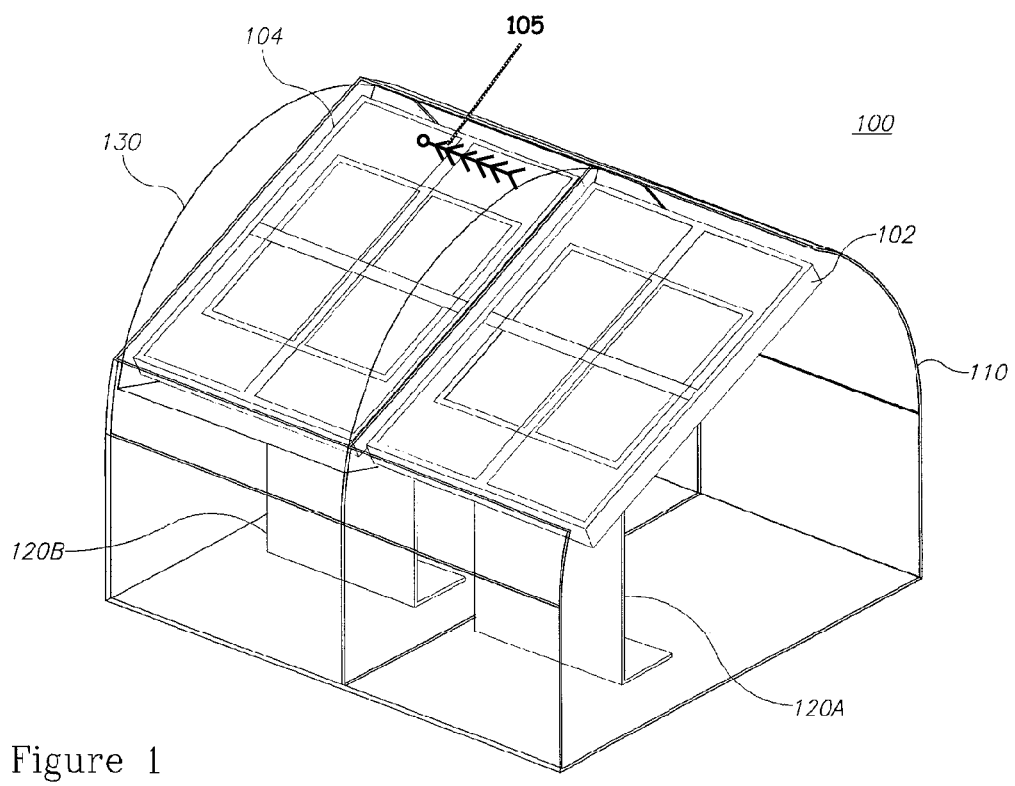
FIG. 1 is a perspective view of the reference sensor with a cover, according to one aspect of the invention.

FIG. 1 is a perspective view of a system 100 configured for detecting the preferred timing for cleaning the solar panels in an electricity production unit (not shown). System 100 includes a simulation sensor 102 and the reference sensor 104 according to one aspect of the invention. In this embodiment the reference sensor 104 and the simulation sensor 102 both comprise of photovoltaic cells. Reference sensor 104 is provided with protection means in the form of a moveable cover 130. Simulation sensor 102 simulates the cells of the solar panel. It is provided with a cover which is similar or identical to the cover provided on the solar panel itself (not shown) which are actually producing the electricity. The reference sensor 104 and the simulation sensor 102 may be positioned on stands 120B and 120A respectively and attached to a housing 110.

Figure 2:
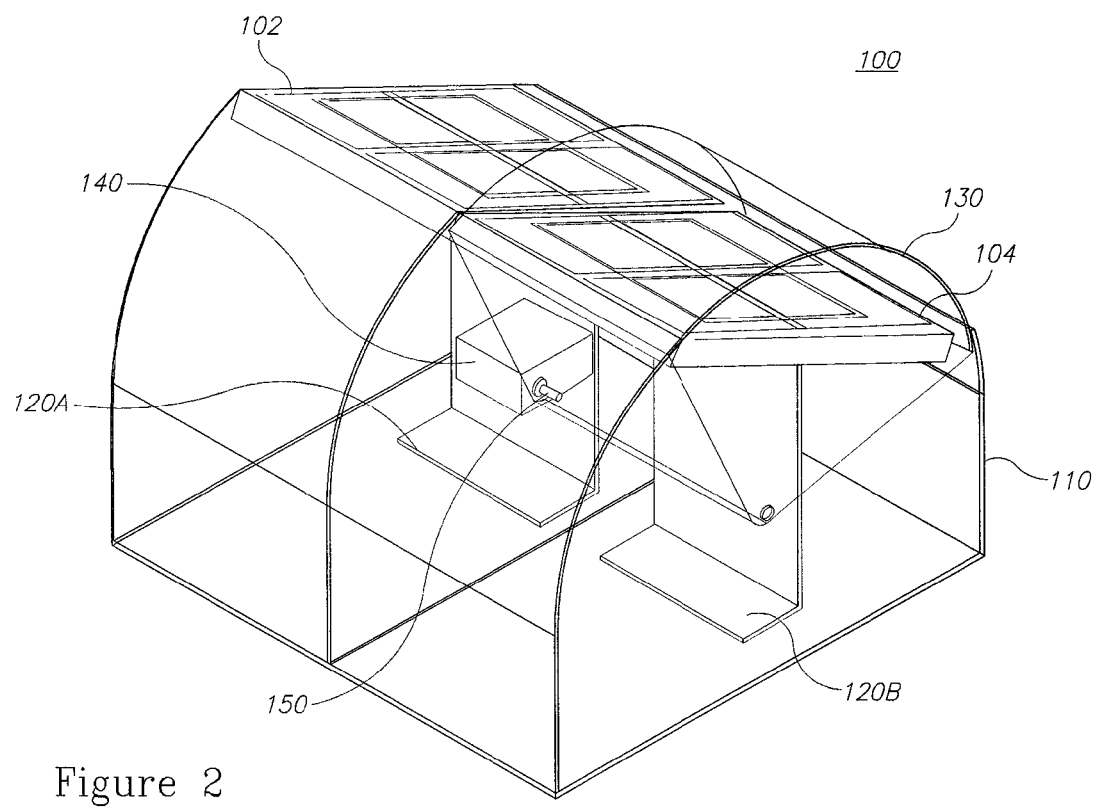
FIG. 2 is a perspective view of the reference sensor with a cover, according to one aspect of the invention.

FIG. 2 is another perspective view of the system 100. In this embodiment, the reference sensor 104 is provided with a cover 130 which is moveable so as to expose the reference sensor to the environment. The cover may be composed of any suitable material, but should preferably be lightweight and easily moveable. Preferably, cover 130 is rotatable along an axis by a driver or a motor 140.

Figure 3:
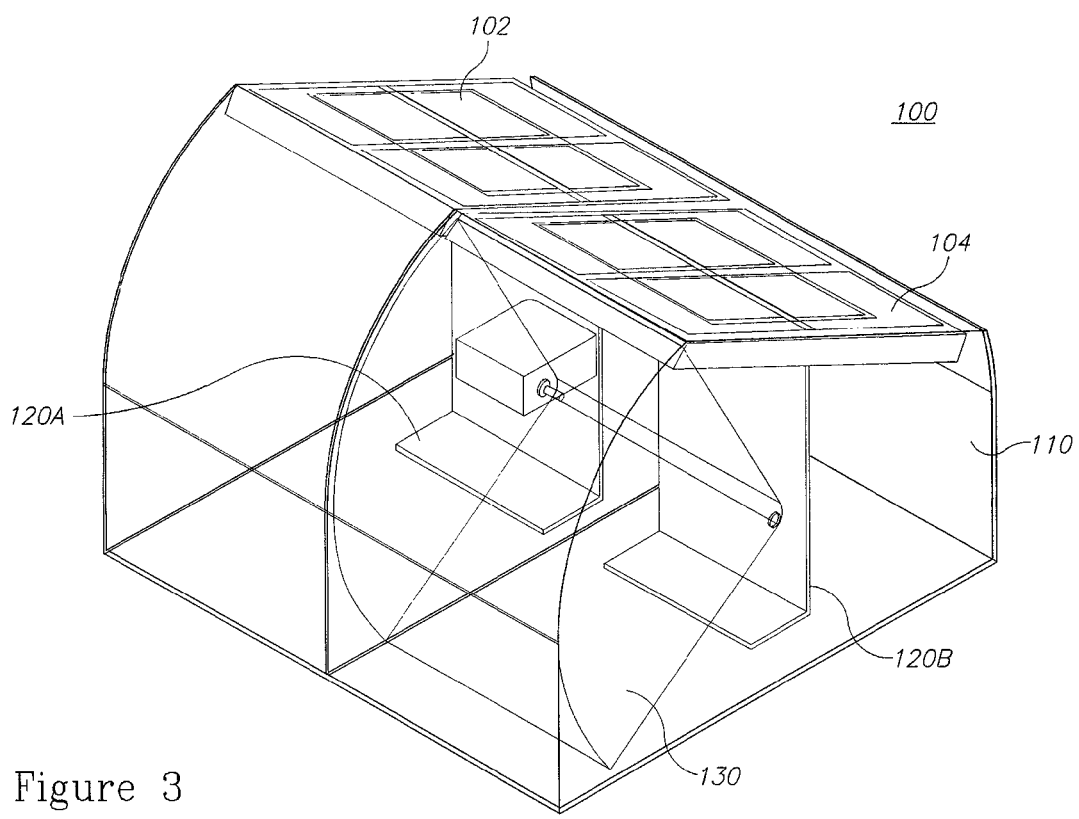
FIG. 3 is a perspective view of the reference sensor in the uncovered state, according to one aspect of the invention.

FIG. 3 is another perspective view of the system 100 in which reference sensor 104 in the uncovered state. Periodically, the cover 130 is moved around so as to expose the reference sensor 104. The reference sensor should not be exposed for long periods of time, therefore, the cover is only moved to expose the reference sensor for a very short period of time, e.g. 1 minute or less. During this period, the reference sensor produces an electrical signal which is of peak efficiency. The signal is compared with the signal produced by the simulation sensor. If the signal produced by the reference sensor is far greater than that produced by the simulation sensor, based on predefined threshold that are determined in a calibration phase, it is determined that the solar panels, including the simulation sensor itself, require cleaning.

If the reference sensor does not produce an electrical signal beyond a predefined value, the operator determines that there is no sunlight and that no cleaning is required.

In some embodiments, cover 130 may be provided on a spindle which can be driven by driving means 140. In the present embodiment, the driving means comprise a servo which drives the spindle to move the cover 130 around so as to expose the reference sensor 104 to the environment.

The reference sensor, therefore, can be kept clean. Optionally, the cover may also be provided with cleaning means so as to clean the reference sensor every time the reference sensor is exposed to the environment. This may be in the form of a brush 105 (FIG. 1) or other cleaning means provided on the interior surface of the cover.

Consistent with some embodiments, system 100 for detecting an optimal timing for cleaning duty solar panels includes photovoltaic cells configured for generating electricity. The 100 system include: a simulation sensor which includes photovoltaic cells identical to the photovoltaic cells of the duty solar panels, wherein the simulation sensor is configured to generate a simulation electrical signal which simulates electricity signal generated by the duty solar panels; a reference sensor which includes photovoltaic cells identical to the photovoltaic cells of the duty solar panels and same area as the simulation sensor, wherein the simulation sensor is configured to generate a reference electrical signal which simulates electricity signal generated by the duty solar panels in a clean condition; and protection means configured to selectively expose the reference sensor for a specified period of time, wherein the system is configured to compare the reference sensor with the electricity signal produced by the simulation sensor when the reference sensor is uncovered and provide an indication that the duty solar panels should be cleaned if a difference between the electricity signals produced by the sensors exceeds a predefined level.

Consistent with some embodiments the protective means is transparent so as the reference sensor is exposed to the same radiation as the simulation sensor so that the temperatures are similar (this is important as the heat affect the efficiency of the solar cells).

Consistent with some embodiments, system 100 issues an alarm in accordance with a programmable threshold indicative of the efficiency of the duty solar panels.

The invention has, so far, been described using various detailed descriptions of embodiments thereof, that are provided by way of example and are not intended to limit the scope of the invention. The described embodiments might comprise different features, not all of which are required in all the variants of the invention. Some embodiments of the invention utilize only some of the features or possible combinations of the features. Variations of embodiments of the invention that are described and embodiments of the invention comprising different combinations of features noted in the described embodiments would occur to professionals skilled in the art. It to be noted that the scope of the invention is limited only by the claims and that the claims be interpreted to include all such variations and combinations.

The invention claimed is:

1. A system for detecting an optimal timing for cleaning duty solar panels which include photovoltaic cells configured for generating electricity, the system comprising:
   a simulation sensor which includes photovoltaic cells identical to the photovoltaic cells of the duty solar panels, wherein the simulation sensor is configured to generate a simulation electrical signal which simulates electricity signal generated by the duty solar panels, and the simulation sensor and its photovoltaic cells are separate and distinct from the duty solar panels and their photovoltaic cells;

a reference sensor which includes photovoltaic cells identical to the photovoltaic cells of the duty solar panels and same area as the simulation sensor, wherein the reference sensor is configured to generate a reference electrical signal which simulates electricity signal generated by the duty solar panels in a clean condition, and the reference sensor and its photovoltaic cells are separate and distinct from the duty solar panels and their photovoltaic cells and from the simulation sensor and its photovoltaic cells; and protection means configured to selectively expose the reference sensor for a specified period of time, wherein the system is configured to operate independently of the duty solar panels being monitored by comparing the simulation signal and the reference signal when the reference sensor is uncovered and providing an indication that the duty solar panels should be cleaned if a difference between the simulation signal and the reference signal exceeds a predefined level.

2. The system according to claim 1, wherein the protection means is transparent.

3. The system according to claim 1, wherein the system issues an alarm in accordance with a programmable threshold indicative of the efficiency of the duty solar panels.

4. The system according to claim 1, wherein said protection means comprises a rotating cover, provided on a spindle such as to allow rotation and driven by driving means to enable the cover to be rotated such as to expose the reference cell.

5. The system according to claim 1, wherein said reference sensor is provided with cleaning means.

* * * * *